(12) United States Patent
Kye

(10) Patent No.: US 6,175,528 B1
(45) Date of Patent: Jan. 16, 2001

(54) REDUNDANCY CIRCUIT AND REPAIR METHOD FOR SEMICONDUCTOR MEMORY DEVICE BY UTILIZING FERROELECTRIC MEMORY

(75) Inventor: Hoon-Woo Kye, Ichon-shi (KR)

(73) Assignee: Hyundai Electronics Industries Co., Ltd., Ichon (KR)

( * ) Notice: Under 35 U.S.C. 154(b), the term of this patent shall be extended for 0 days.

(21) Appl. No.: 09/475,280

(22) Filed: Dec. 30, 1999

(30) Foreign Application Priority Data

Dec. 30, 1998 (KR) .................................................. 98-61150

(51) Int. Cl.⁷ ...................................................... G11C 7/00
(52) U.S. Cl. ...................... 365/200; 365/145; 365/189.02
(58) Field of Search ................................... 365/200, 145, 365/129, 189.02, 189.01

(56) References Cited

U.S. PATENT DOCUMENTS

| | | | |
|---|---|---|---|
| 5,307,311 | 4/1994 | Sliwa, Jr. ............................... | 365/174 |
| 5,523,974 | * 6/1996 | Hirano et al. ......................... | 365/200 |
| 5,612,238 | 3/1997 | Sato et al. .............................. | 438/43 |
| 5,673,028 | 9/1997 | Levy ..................................... | 340/635 |
| 5,716,875 | 2/1998 | Jones, Jr. et al. ....................... | 438/3 |
| 5,726,930 | * 3/1998 | Hasegawa et al. ................... | 365/145 |
| 5,751,627 | 5/1998 | Ooishi .................................. | 365/154 |
| 5,808,943 | 9/1998 | Sato et al. ............................. | 365/200 |
| 5,828,599 | 10/1998 | Herdt ............................... | 365/185.08 |

FOREIGN PATENT DOCUMENTS

| | | |
|---|---|---|
| 7-073682 | 3/1995 | (JP) . |
| 7-115141 | 5/1995 | (JP) . |
| 9-008247 | 1/1997 | (JP) . |
| 9-128991 | 5/1997 | (JP) . |
| 11-102980 | 4/1999 | (JP) . |
| 11-103024 | 4/1999 | (JP) . |
| 11-120797 | 4/1999 | (JP) . |
| 11-121705 | 4/1999 | (JP) . |

* cited by examiner

Primary Examiner—David Nelms
Assistant Examiner—Hoai V. Ho
(74) Attorney, Agent, or Firm—Jacobson, Price, Holman & Stern, PLLC

(57) ABSTRACT

A redundancy address bit programming circuit including a redundancy memory cell, includes: program pads for providing signals to first and second program nodes; a ferroelectric capacitor programmed according to a bit value corresponding to a defected address, coupled between the first and second nodes; a load capacitor coupled between the second program node and a ground; a power-up signal generator means for generating a power-up signal to be coupled to the first program node, wherein the power-up signal follows a level of a power signal at a beginning of a power signal supply, and is maintained as a ground level during a stable level state of the power signal supply; a latch means for latching the second program node signal at the beginning of the power signal supply and outputting a latched signal during the stable level state of the power signal supply; and a multiplexer for selectively outputting one of an address bit signal and a reversed address bit signal in response to the latched signal.

14 Claims, 16 Drawing Sheets

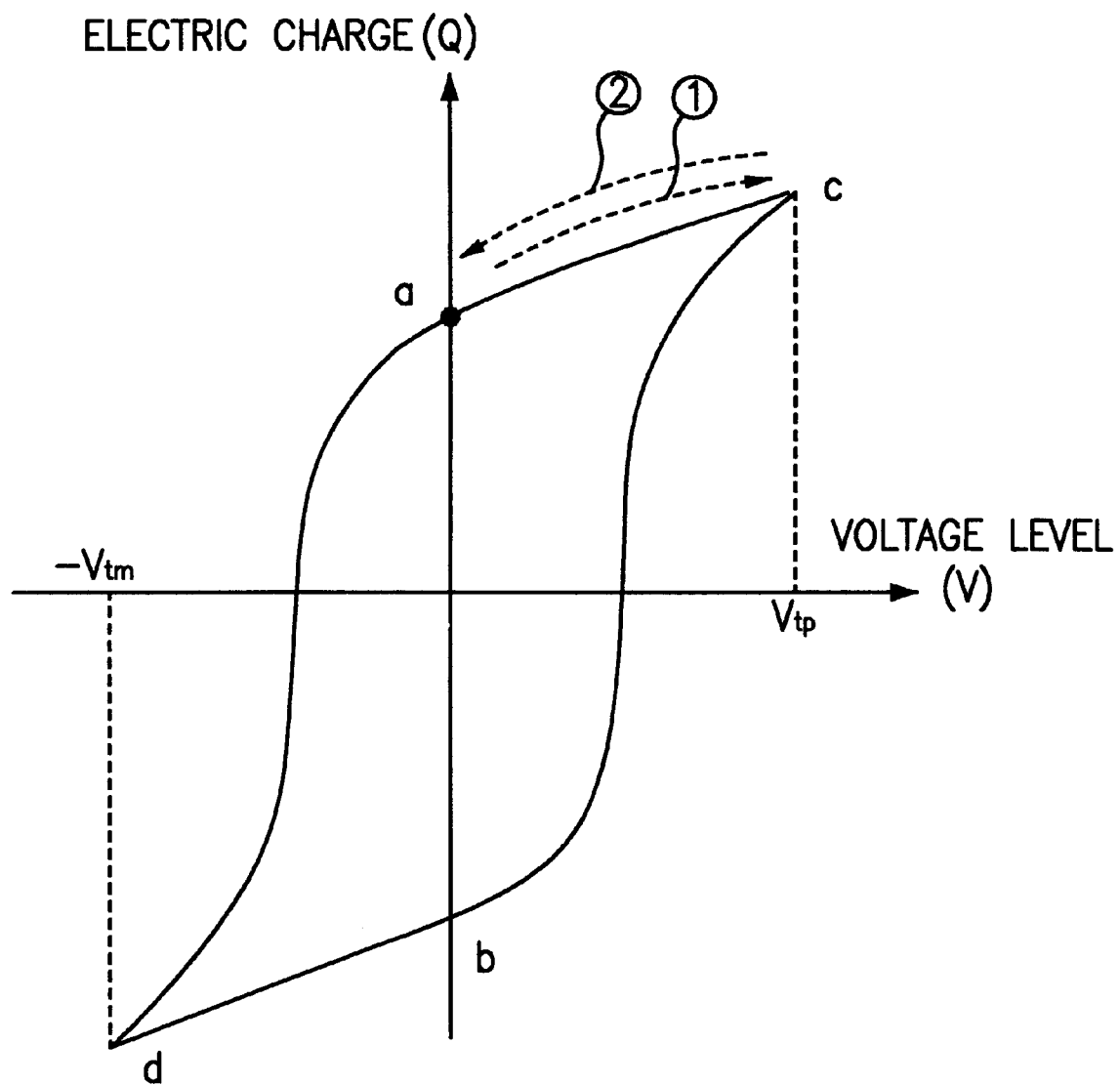

REDUNDANCY CIRCUIT AND REPAIR METHOD FOR SEMICONDUCTOR MEMORY DEVICE BY UTILIZING FERROELECTRIC MEMORY

FIELD OF THE INVENTION

The present invention relates to a semiconductor device; and, more particularly, to a redundancy circuit for a semiconductor memory device.

DESCRIPTION OF THE PRIOR ART

As a high integration proceeds in a semiconductor memory device, lots of semiconductor memory cells are integrated in a chip. Even if one of memory cells is defected, the semiconductor memory chip is determined as a degraded semiconductor and cannot be used commercially. Thus, as an integration degree becomes higher, there becomes higher the probability that the memory chip is to be determined as a defected one, in fact it becomes almost impossible to manufacture the semiconductor memory chip with the economical efficiency. In order to solve these problems, employing a redundancy circuit is popular for this technique field.

The redundancy circuit consists of redundancy memory cells and redundancy address programming circuits. The redundancy memory cells and the redundancy address programming circuits are constituted at the semiconductor manufacturing process. The redundancy address programming circuit is programmed so that a redundancy memory cell would replace a memory cell, which is determined as a defected one at the test step. The above-mentioned programming operation is called as a "repair", generally, this operation is processed by selectively cutting fuses contained in the redundancy address programming circuits by using a laser beam.

When a redundancy word line is to be used in order to access a plurality of the redundancy memory cells, a redundancy address programming circuit per each redundancy word line can be used, and a redundancy address bit programming circuit corresponding to an used address bit number can be contained in each redundancy address programming circuit.

FIG. 1 is a conventional redundancy address bit programming circuit, which utilizes a fuse.

Referring to FIG. 1, the redundancy address bit programming circuit depicted in FIG. 1 is a circuit generally constituted one by one in response to each address bit. Therewith, the input signals are designated by POWER-UP, a corresponding address bit signal A, and a its reversed address bit signal /A, while the output is represented by a character of Q. The redundancy address bit programming circuit contains transmission gates T2 and T4, an inverter INV2, a fuse F2, and NMOS transistors N2 and N4.

In FIG. 1, a fuse F2 may be programmed—selectively cut—in accordance with the bit corresponding to an address of a defected cell. As can be seen in FIG. 2, the input signal POWER-UP increase when a power is supplied, then the input signal POWER-UP drops suddenly and keeps in "low' level. Referring to the case that the fuse is cut, an NMOS transistor N4 becomes turn-on by the high level of the input signal POWER-UP inscribed to the NMOS transistor N4's gate. Accordingly, a node NA becomes low level, the transmission gate T2 becomes turn-on, and the transmission gate T4 becomes turn-off, then the address bit signal A is outputted to Q. On the other hand, the "low" level of the node NA becomes reversed, i.e., as "high" level, thereafter the reversed "high" level signal is inscribed to NMOS transistor N2's gate. So, the NMOS transistor N2 becomes turn on, then the node NA keeps stable as "low" level. That is, even though the power-up becomes again "low" level after a certain time, the node NA level keeps stable by a latch that consists of the inverter INV2 and the NMOS transistor N2.

On the contrary, referring to the case that a fuse F2 is not cut, the node NA may have the distributed voltage level in accordance with each resistance value of the fuse F2 and the NMOS transistor N4. Generally, since the fuse F2 is constituted from the conductive poly-sillicon, the level of the node NA has the level of the voltage signal VDD. Since the level of the node NA is latched by the inverter INV2 and the NMOS transistor N2, the transmission gate T2 becomes turn-off and the transmission gate T4 becomes turn-on by the "high' level of the node NA, then the reversed address bit signal /A is outputted.

FIG. 3 shows the redundancy address programming circuits containing the address bit programming circuits, such as those of FIG. 1, which is a circuit for programming the memory cells coupled in a line of the redundancy word for the address of the defected memory cells. Herein, for the sake of convenience, the address of only 4 bits would be explained.

Referring to FIG. 3, the redundancy address programming circuit is provided with four redundancy address bit programming circuits 102, 104, 106 and 108, a redundancy master programming circuit 100, NAND gates ND2, and ND4, and a NOR gate NR. Four fuses of the redundancy address bit programming circuits 102, 104, 106 and 108 are programmed in accordance with an address bit corresponding to each defected memory cell. For example, if an address of a defected memory cell is "1001", the fuses in redundancy address bit programming circuit 104 and 106 remains not cut, the fuses in the redundancy address bit programming circuit 102 and 108 are cut. The redundancy master programming circuit 100 includes a master fuse FM, NMOS transistors N6 and N8, and an inverter INV4. If the master fuse FM is cut, the output M becomes a "high" level, if not, the output M becomes a "low" level. As a result, the maser fuse FM in the redundancy master programming circuit 100 can be programmed, according as whether a redundancy memory cell would be used or not.

In FIG.3, a redundancy word line selection signal RWL can be outputted by executing the logic multiplication process from the NAND gates ND2 and ND4 and the NOR gate NR2. Accordingly, if signals Q0, Q1, Q2, Q3, and M are all "high" level, the redundancy word line selection signal RWL becomes a "high" level, if not, the RWL becomes "low"level. As a result, if the address of the defected memory cell is inputted, i.e., A0, A1, A2, A3 are 1, 0, 0, 1 in sequence, the RWL becomes a "high" level.

However, there is a problem that the conventional redundancy programming circuit is to need high-priced laser equipments for the above fuse programming, so there exists a demerit that the manufacturing cost becomes higher.

SUMMARY OF INVENTION

It is, therefore, an object of the present invention to provide a redundancy address bit programming circuit of a semiconductor memory device for rapidly and easily repairing a defected cell without the help of high-priced laser equipment.

It is another object of the present invention to provide a redundancy address programming circuit of the semiconductor memory including the redundancy address bit programming circuits.

In accordance with an embodiment of the present invention, there is provided a redundancy address bit programming circuit including a redundancy memory cell, comprising: program pads for providing signals to first and second program nodes; a ferroelectric capacitor programmed according to a bit value corresponding to a defected address, coupled between the first and second nodes; a load capacitor coupled between the second program node and a ground; a power-up signal generator means for generating a power-up signal to be coupled to the first program node, wherein the power-up signal follows a level of a power signal at a beginning of a power signal supply, and is maintained as a ground level during a stable level state of the power signal supply; a latch means for latching the second program node signal at the beginning of the power signal supply and outputting a latched signal during the stable level state of the power signal supply; and a multiplexer for selectively outputting one of an address bit signal and a reversed address bit signal in response to the latched signal.

In accordance with another embodiment of the present invention, there is provided a redundancy address programming circuit for use in a semiconductor memory device, comprising: a) a power-up generator means for generating a power-up signal, wherein a level of the power-up signal follows a level of a power signal at a beginning of a power signal supply and becomes a ground level during a stable level state of the power signal supply; b) a plurality of redundancy address bit programming circuits, each having a first built-in ferroelectric capacitor, wherein the first built-in ferroelectric capacitor is programmed in response to a corresponding defected address bit value, for detecting a coincidence between the corresponding defected address bit value and an input address bit value; c) a master programming circuit having a second built-in ferroelectric capacitor, wherein the second built-in ferroelectric capacitor is programmed according as whether a defected memory cell is replaced by a corresponding redundancy memory cell; and d) a detection circuit for activating a redundancy word line selection signal by detecting whether a defected address corresponding to that of a redundancy memory cell is inputted on the basis of outputs from the redundancy bit programming circuits and the output of the master programming circuit, wherein each redundancy address bit programming circuit includes: 1) program pads for applying signals to program nodes, wherein the power-up signal is inputted to the program node; 2) a ferroelectric capacitor, which is coupled between the program nodes, and which is programmed in accordance with a corresponding defected address bit value; 3) a load capacitor coupled between the program node and a ground; 4) a latch means, wherein the program node signal is latched at the beginning of the power signal supply, and wherein the latched status is kept and outputted during a stable level state of the power signal supply; and 5) a multiplexer for selectively outputting one of an address bit signal and a reversed address bit signal in accordance with a latched signal.

In accordance with furthermore another embodiment of the present invention, there is provided a redundancy address bit programming circuit including a redundancy memory cell, comprising: a) first and second program pads for providing signals to first and second program nodes; b) a ferroelectric capacitor programmed according to a bit value corresponding to a defected address, coupled between the first and second program nodes; c) a load capacitor coupled between the second program node and a ground; d) a latch means for latching a second program node signal at the beginning of a power signal supply and outputting a latched signal during a stable level state of the power signal supply; e) a power-up/down signal generator means for generating a power-up/down signal to be coupled to the first program node, wherein the power-up signal follows the level of a power signal at a beginning of a power signal supply, and is maintained as a ground level during a stable level state of the power signal supply; f) a power-down signal generator means for generating a power-down signal in response to the latched signal; and g) a multiplexer for selectively outputting one of a address bit signal and a reversed address bit signal in response to the latched signal.

In accordance with still furthermore another embodiment of the present invention, there is provided a redundancy address programming circuit for use in a semiconductor memory device, comprising: a) a power-up generator means for generating a power-up signal, wherein a level of the power-up signal follows a level of a power signal at a beginning of a power signal supply and becomes a ground level during a stable level state of the power signal supply; b) a plurality of redundancy address bit programming circuits, each having a first built-in ferroelectric capacitor, wherein the first built-in ferroelectric capacitor is programmed in response to a corresponding defected address bit value, for detecting a coincidence between the corresponding defected address bit value and an input address bit value; c) a master programming circuit having a second built-in ferroelectric capacitor, wherein the second built-in ferroelectric capacitor is programmed according as whether a defected memory cell is replaced by a corresponding redundancy memory cell; and d) a detection circuit for activating a redundancy word line selection signal by detecting whether a defected address corresponding to that of a redundancy memory cell is inputted on the basis of an output from a redundancy bit programming circuit and an output of the master programming circuit; wherein the redundancy address bit programming circuit including a redundancy memory cell, comprising: a) first and second program pads for providing signals to first and second program nodes; b) a ferroelectric capacitor programmed according to a bit value corresponding to the defected address, coupled between the first and second program nodes; c) a load capacitor coupled between the second program node and a ground; d) a latch means for latching a second program node signal at the beginning of the power signal supply and outputting a latched signal during a stable level state of the power signal; e) a power-up/down signal generator means for generating a power-up/down signal to be coupled to the first program node, wherein the power-up signal follows a level of the power signal at the beginning of a power signal supply, and is maintained as a ground level during a stable level state of the power signal supply; f) a power-down signal generator means for generating the power-down signal in response to a latched signal; and g) a multiplexer for selectively outputting one of an address bit signal and a reversed address bit signal in response to the latched signal.

BRIEF DESCRIPTION OF THE DRAWING

The objects and features of the present invention will become apparent from the following description of preferred embodiments given in conjunction with the accompanying drawings, in which:

FIGS. 6B and 6C show a characteristic graph of a status change of the ferroelectric capacitor according to a voltage level shown in FIG. 6A;

FIGS. 7B and 7C show a characteristic graph of a status change of the ferroelectric capacitor according to a voltage level shown in FIG. 7a;

DETAILED DESCRIPTION OF THE PREFERRED EMBODIMENTS

Figure 1:
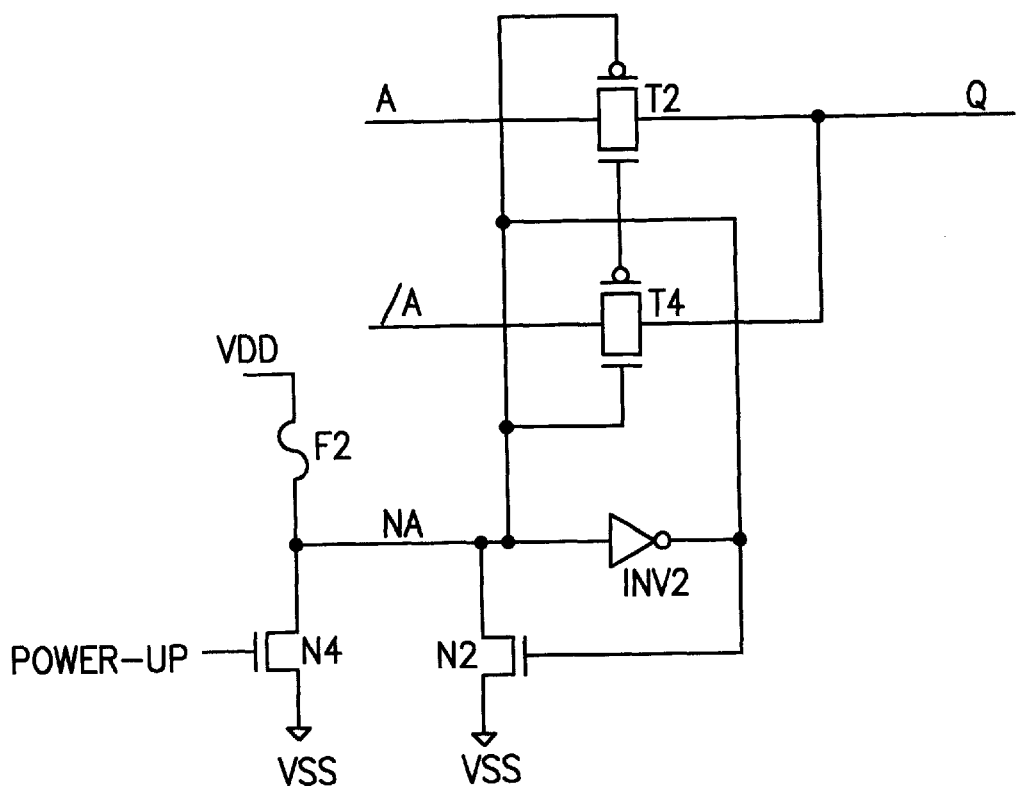
FIG. 1 represents a circuit diagram of a conventional redundancy address bit programming circuit using a fuse.
Figure 2:
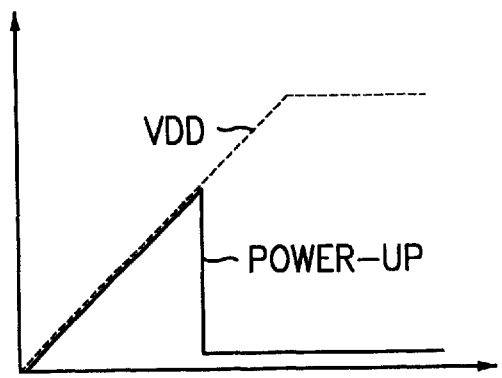
FIG. 2 illustrates a waveform of a POWER-UP input signal used at the redundancy address bit programming circuit shown in FIG. 1.
Figure 3:
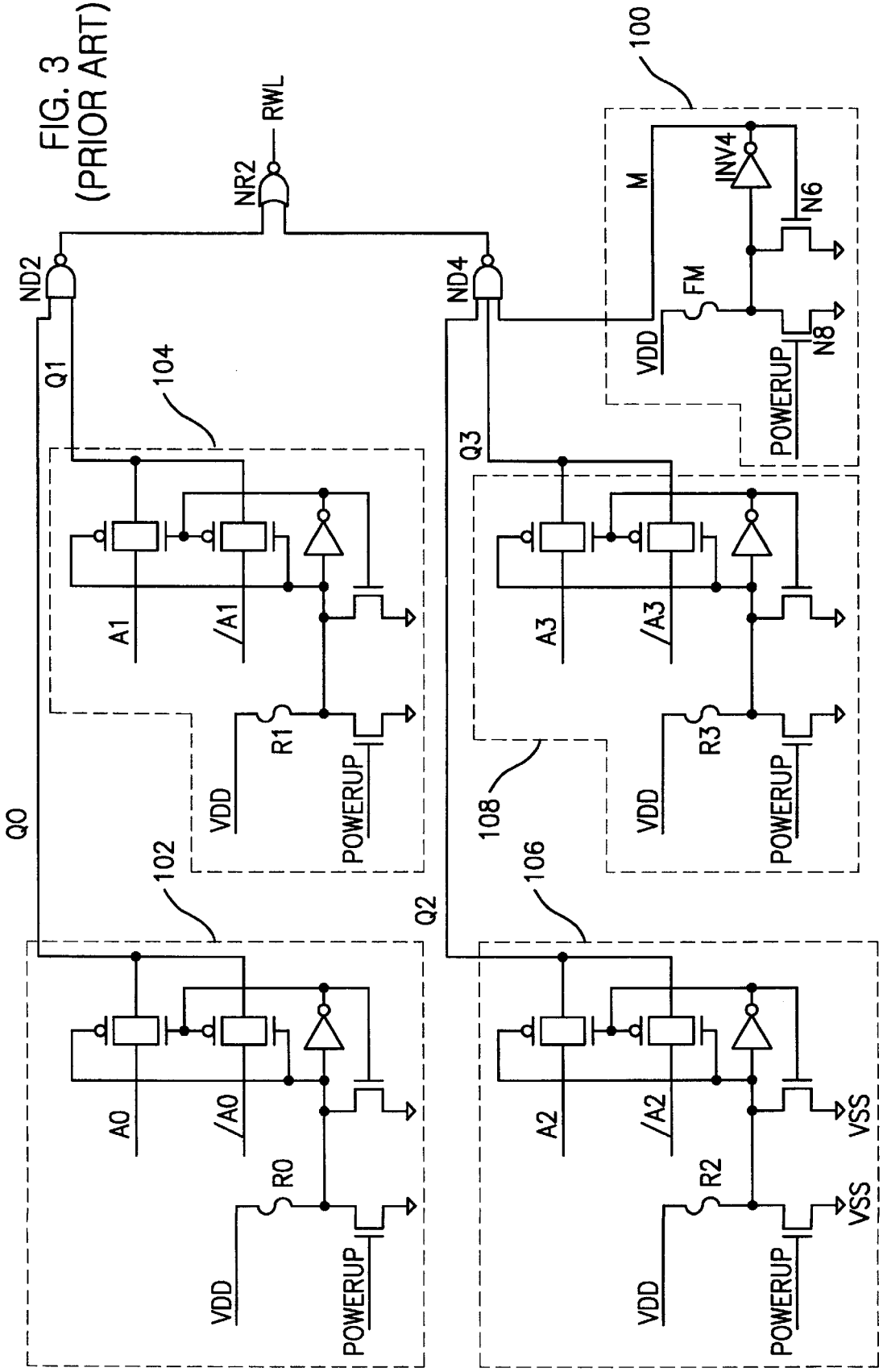
FIG. 3 describes a circuit diagram of a conventional redundancy address programming circuit.
Figure 4A:
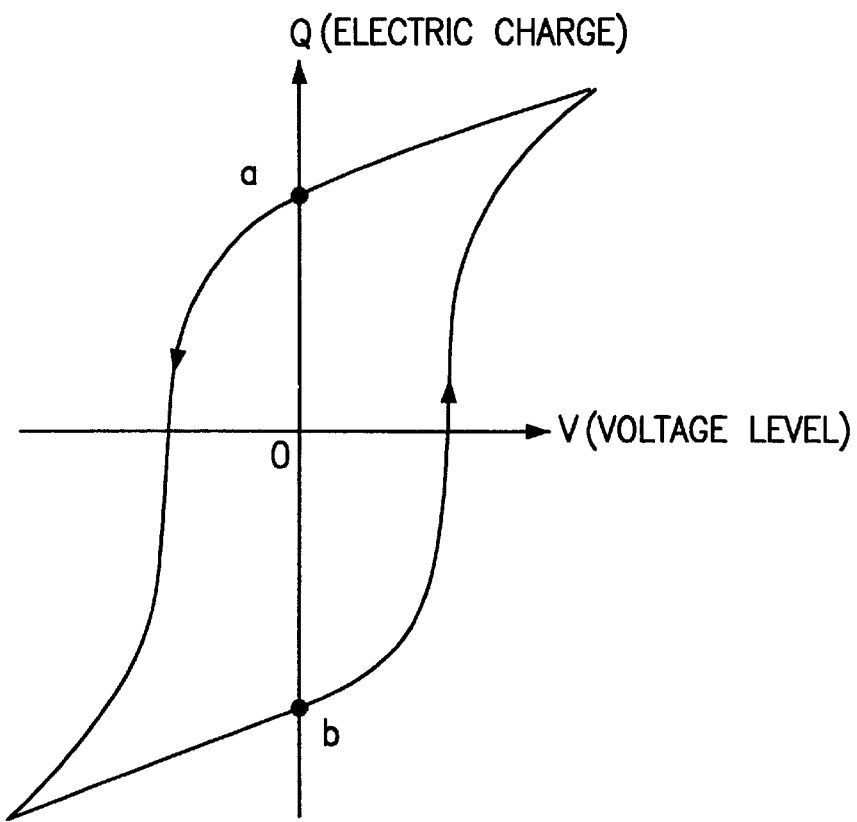
FIG. 4A shows a characteristics graph for a ferroelectric capacitor employed in the present invention.
Figure 4B:
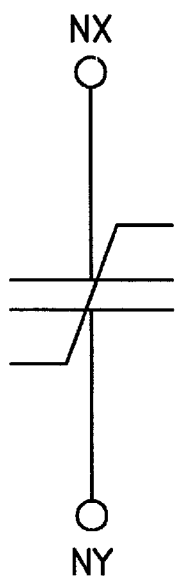
FIG. 4B shows a circuit symbols for a ferroelectric capacitor employed in the present invention.

Referring to FIGS. 4A to 4B, a characteristics graph for a ferroelectric capacitor employed in the present invention is represented.

Figure 5:
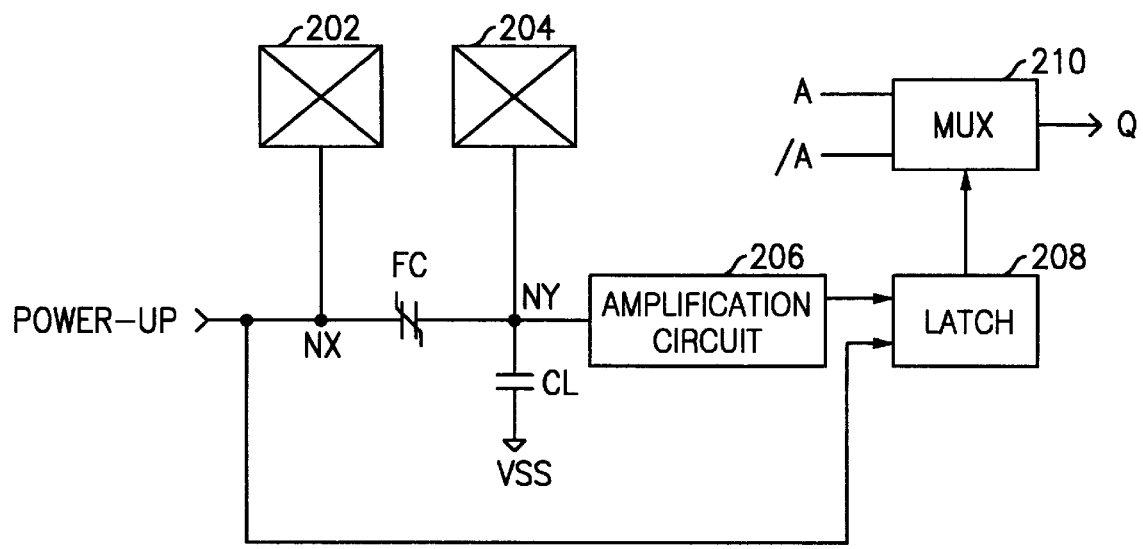
FIG. 5 provides a redundancy address bit programming circuit for a semiconductor memory device in accordance with one embodiment of the present invention.

Referring to the FIG. 5, a redundancy address bit programming circuit in accordance with the present invention includes a ferroelectric capacitor FC, a capacitance CL, an amplification circuit 206, a latch 208, and a multiplexer 210. A multiplexer for selectively outputs one of an address bit signal and a reversed address bit signal in accordance with the output of the latch 208. In addition, two programming pads 202 and 204 are included to apply a power at both ends of the ferroelectric capacitor FC in the redundancy address bit programming circuit.

Hereinafter, referring to FIGS. 6 and 7, the programming for the ferroelectric capacitor would be explained.

Figure 6A:
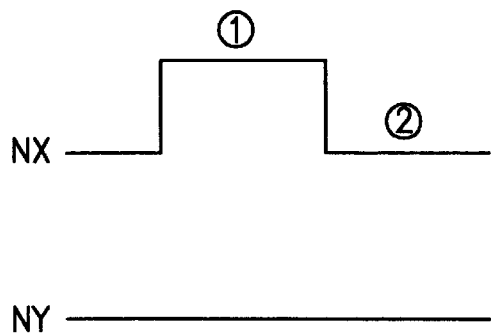
FIG. 6A depicts a timing diagram of a voltage level to be applied to nodes NX, and NY, in order to inscribe data "0" in the ferroelectric capacitor FC shown in FIG. 5.
Figure 6B:
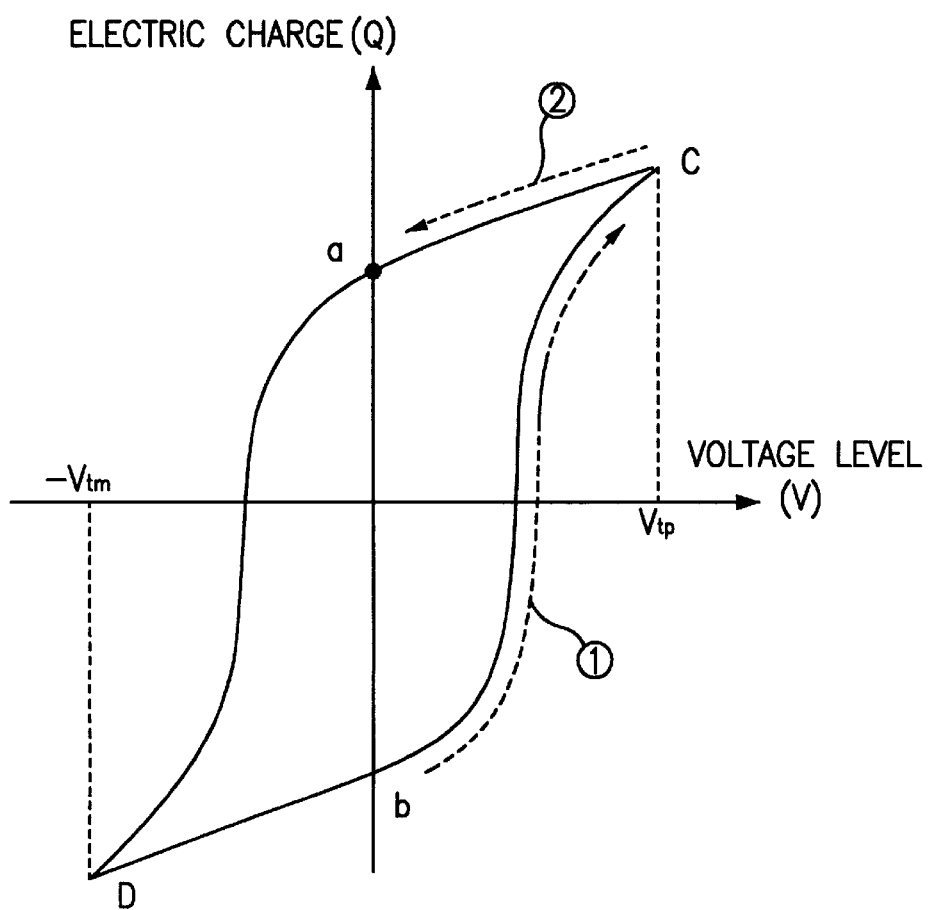
Figure 7A:
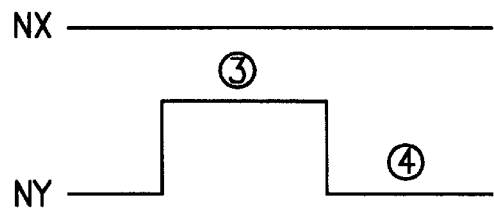
FIG. 7A depicts a timing diagram of a voltage level to be applied to the nodes NX, and NY in order to inscribe data "1" in the ferroelectric capacitor FC shown in FIG. 5, FIG.

FIG. 6A shows the power level which can be applied at the nodes NX and NY as a POWER-UP input signal to inscribe the data "0" in the ferroelectric capacitor FC shown in FIG. 5. As shown, in order to inscribe the data "0", while a ground level VSS is continuously being applied to the node NY, the pulse, which is "high" level during a certain period, would be applied to the node NX. The status change of the ferroelectric capacitor FC in the case that the ferroelectric capacitor FC is in a state of "B" and in the case that the signal is being applied as mentioned in FIG. 6A would be depicted in FIG. 6B. During the period ① that a positive power is applied, the ferroelectric capacitor changes from a status "B" to a status "C", then during the period ② that an external power is removed, the ferroelectric capacitor is from the status "C" to a status "A". On the other hand, as described in FIG. 6C, when an initial status is in "A', during the period ①, the ferroelectric capacitor changes into the "C", and during the period ②, the ferroelectric capacitor is into the status "A". Accordingly, when a power applied to the NX in comparison with the node NY is higher than a positive threshold voltage Vtp, the status of the ferroelectric capacitor changes into "A". FIG. 7A shows a voltage level that should be applied to the nodes NX and NY in order to inscribe the data "1" in the ferroelectric capacitor shown in FIG. 5, and FIGS. 7B and 7C show the status change of the ferroelectric capacitor.

According to the FIG. 7A, in order to inscribe the data "1", while the ground level VSS is being continuously applied to the node NX, a "high" level pulse during a certain period is applied to the node NY. Referring to this applied waveform on the basis of the node NY, it is construed that a negative pulse is applied to the ferroelectric capacitor. Herein, the negative pulse is to be lower than the negative threshold voltage—Vtm, i.e., the absolute value of the pulse amplitude is higher than the Vtm.

Figure 8A:
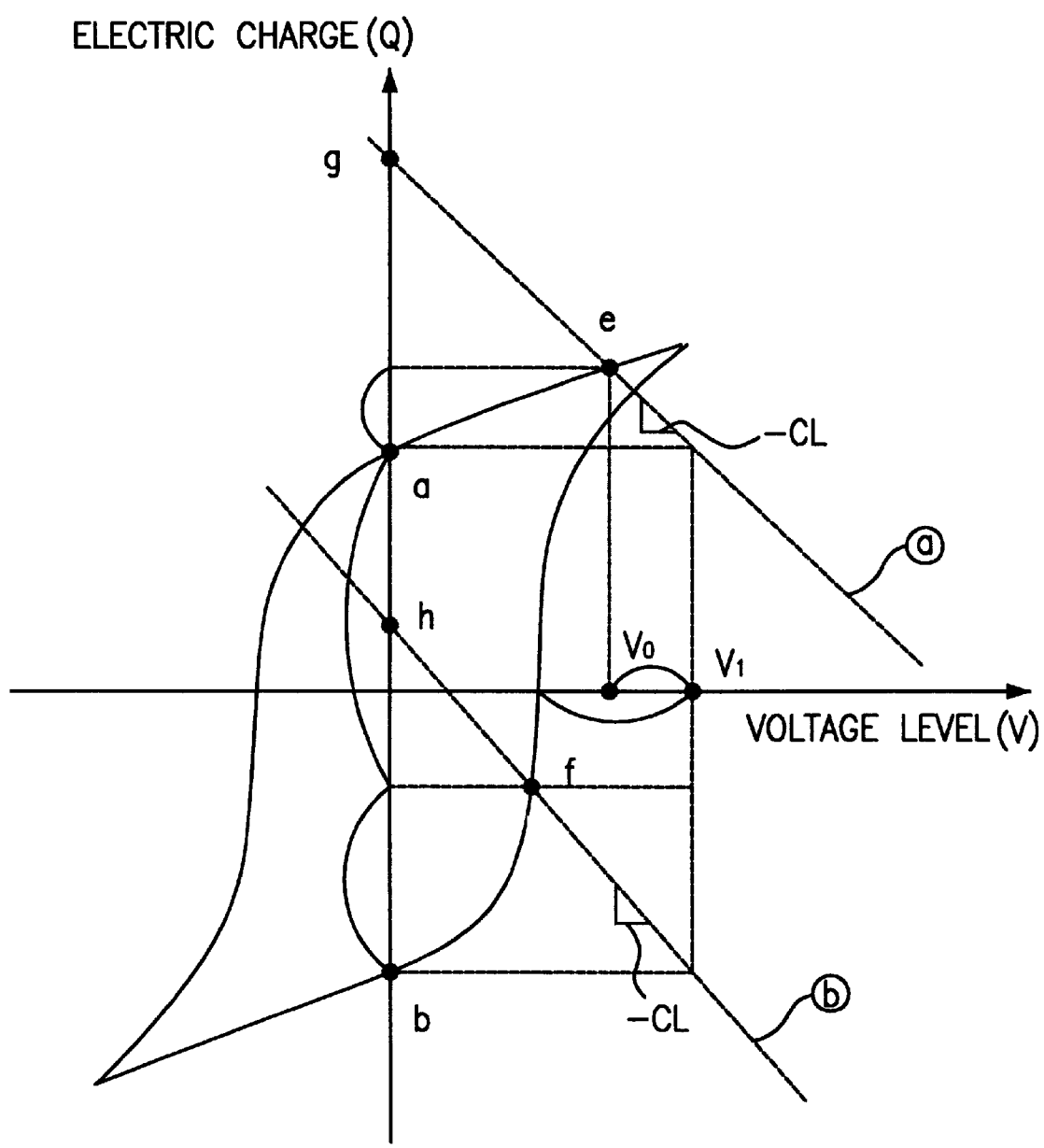
FIGS. 8A to 8C explain exemplary diagrams of a level change of the node NY according to the change of the power-up, after programming the data "0" or the data "1" at a ferroelectric capacitor employed in the present invention.
Figure 8B:
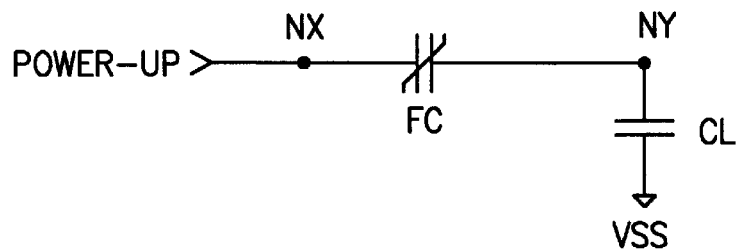
Figure 8C:
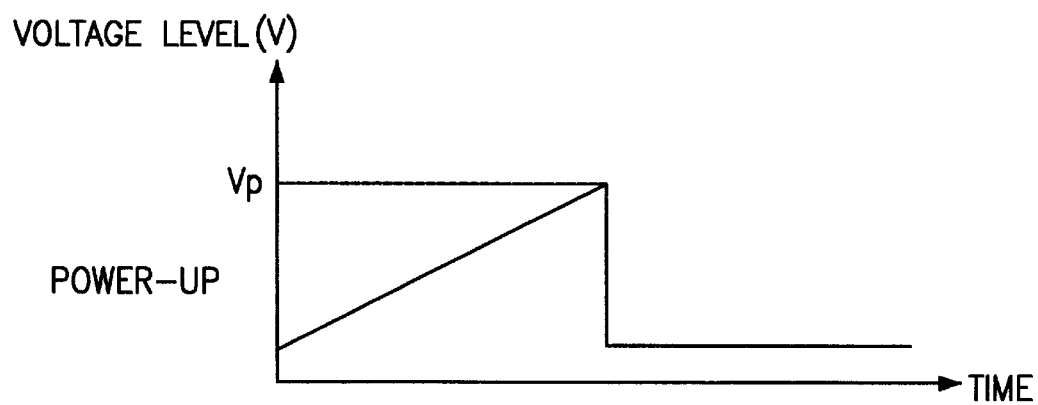
Figure 8C:
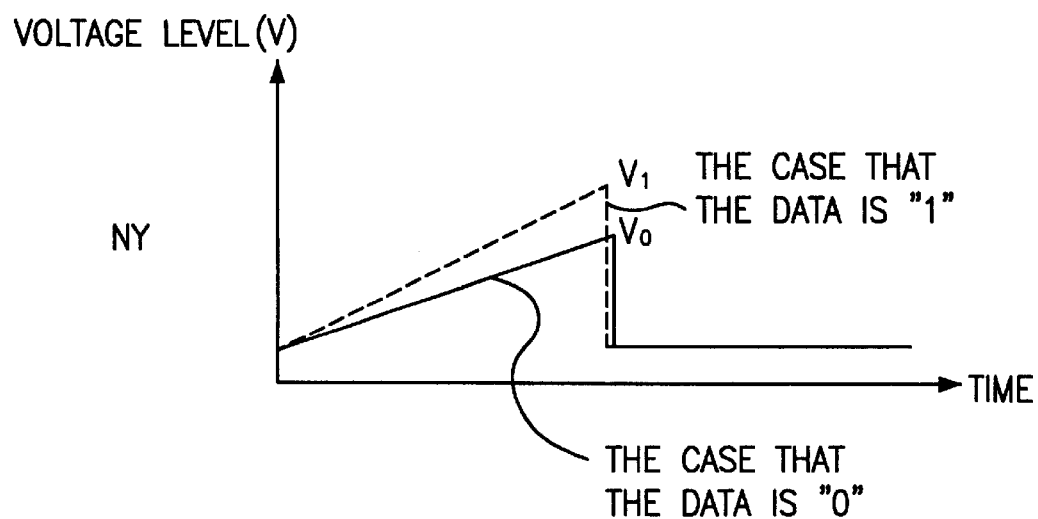

FIGS. 8A to 8C explain a level of the node NY in accordance with the power-up input signal, after the ferroelectric capacitor is programmed into data "0'or data "1".

Figure 7B:
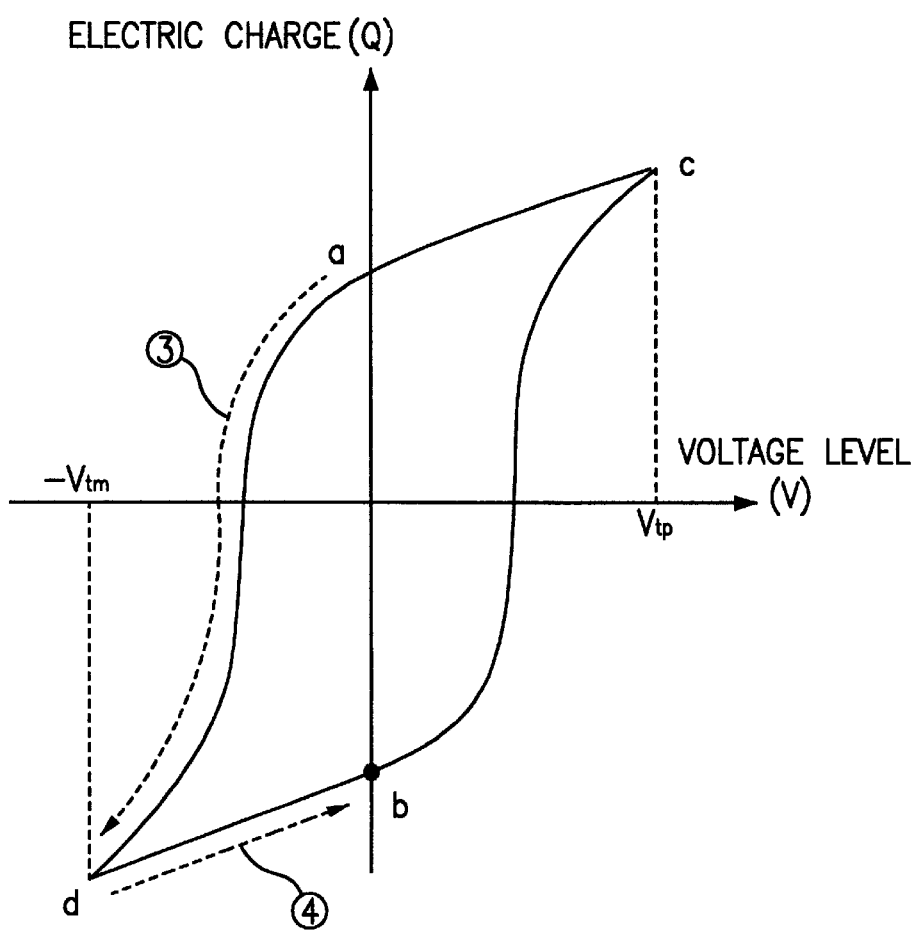
Figure 7C:
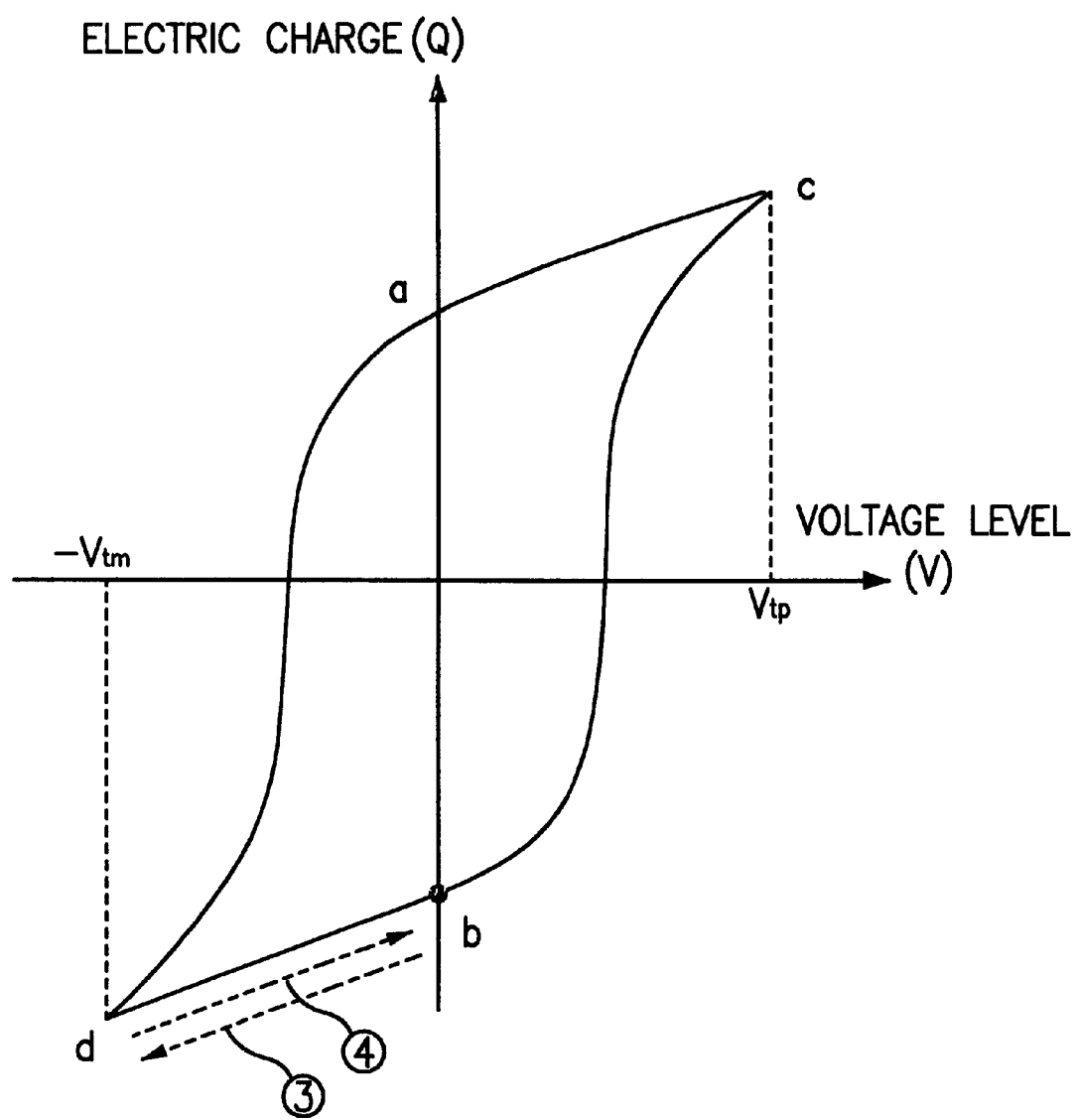

As represented in FIG. 7B, during the period ③ that an initial status is "A", wherein the negative (−) pulse is applied, the ferroelectric capacitor changes into the "D", then during the period ④ that the external applied voltage disappears, the ferroelectric capacitor changes into the "B". In addition, when an initial status is "B", during the period ③ the ferroelectric capacitor discharges into the "D", then during the period ④, the ferroelectric capacitor changes into the "B". That is, as the lower voltage in comparison with the negative threshold voltage–Vtm is applied, the status of the ferroelectric capacitor can be programmed as "B", i.e., the data "1".

In addition, in FIGS. 6 and 7, the status of "A" is supposed to be the data "0", while the status of "B" is supposed to be the data "1", also the opposition can be practicable.

As represented in FIG. 8C, the power-up input signal increases in conformity with the voltage signal VDD at the beginning of the power supply, then the power-up input signal decreases back to the ground level during the supply of the power signal VDD.

Referring to FIG. 8B, when the external voltage is not applied, the ferroelectric capacitor FC accumulates an electric charge in accordance with the programming status. The initial electric charge is called as "Q0". The initial electric charge "Q0" is accumulated at the load capacitor CL, then the node voltage level at the initial status is identical to that of the ground level. As the level of the power-up input signal increases, the voltage level is also applied to the ferroelectric capacitor FC and the load capacitor CL. Herein, the voltage level applied to the ferroelectric capacitor FC is to be called as "VF", the voltage applied to the load capacitor CL is to be called as "VL", and the voltage level of the power-up input signal is to be called as "VP", it is construed that VL=VP−VF. On the other hand, the electric charge accumulated at the ferroelectric capacitor FC is to be QF, the electric charge accumulated at the load capacitor CL is to be called as "QL", then it is construed that QF=QL. In addition, a relationship between the electric charge accumulated at the load capacitor CL and the applied voltage level is that QL=CL•VL+Q0, as follows:

VL=(QL−Q0)/CL=VP−VF                Eq. 1

QF=QL=(VP−VF)•CL+Q0

QF=−CL•VF+CL•VP+Q0                Eq. 2

Meanwhile, in the FIG. 8A, an x-axis represents the voltage level VF applied at the both sides of the ferroelectric capacitor FC, while an y-axis represents the electric charge accumulated at the ferroelectric capacitor FC. Additionally, the Eq. 2 can be construed as a linear graph, whose gradient is−CL, and whose y-axis cross point is (CL•VP+Q0). Herein, Q0 can be the electric charge of the "A" status or can be the electric charge of the "B"status according to the program status of the ferroelectric capacitor FC.

If the power-up input signal is applied to the ferroelectric capacitor FC, which is in the status of the "A", as can be seen in the FIG. 8C, and when the voltage level of power-up input signal is identical to the peak level VP, the ferroelectric capacitor FC is transformed into the point which is the cross point "E" between the linear (a) and the hysteresis curve, so the voltage level VP−V0 is applied at the both sides of the load capacitor CL, and the power potential of the node NY may be "VP−V0". In succession, as the level of the power-up input signal falls down, the voltage level of the node NY also falls down.

In addition, if the power-up input signal, as can be seen in the 8c, is applied to the ferroelectric capacitor FC having the "B" status, and when the power-up input signal is in the peak level VP, the ferroelectric capacitor can be transformed into the cross point "F" between the linear (b) and the hysteresis curve, so the voltage of the "VP−V1" is applied to the both sides of the load capacitor CL, then the power voltage level of the node NY is to be "VP−V1". In succession, the level of the power-up input signal falls down, then the power potential of the node NY also falls down. The reference of the detail is referred at the graph 8c.

Referring back to FIG. 5, the amplification circuit 206 amplifies the voltage level of the node NY, while the latch 208 latches an output of the amplification circuit 206. The latch 208 latches the amplified signal from the node NY, when the power-up input signal is "high" level, while the latch 208 maintains the previous amplified signal, when the power-up input signal is a "low" level. The multiplexer 210 outputs one of the address bit signal A and the reversed address bit signal /A according to the output of the latch 208.

Figure 9:
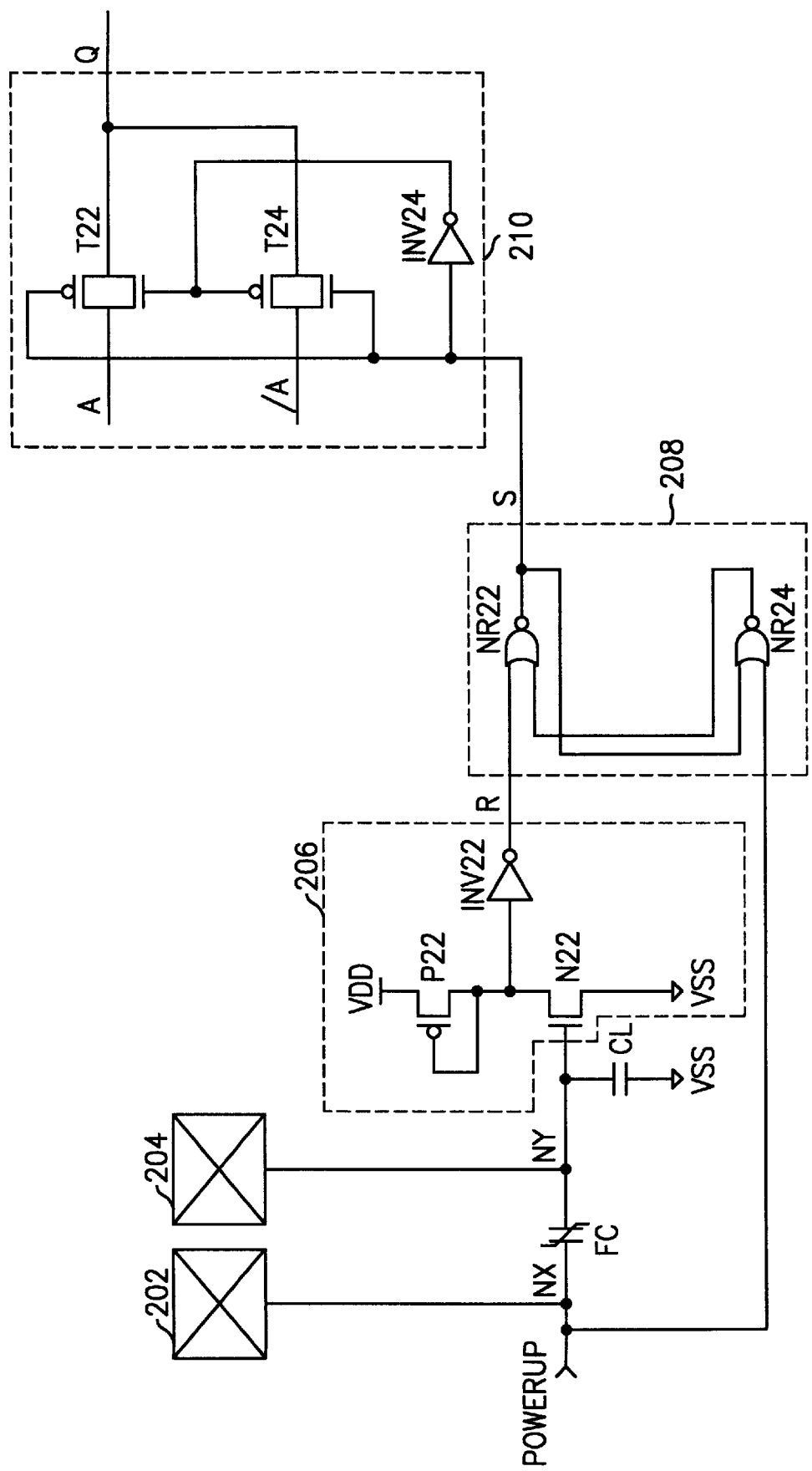
FIG. 9 is a circuit diagram showing a redundancy address bit programming circuit in accordance with one embodiment of the present invention.
Figure 10:
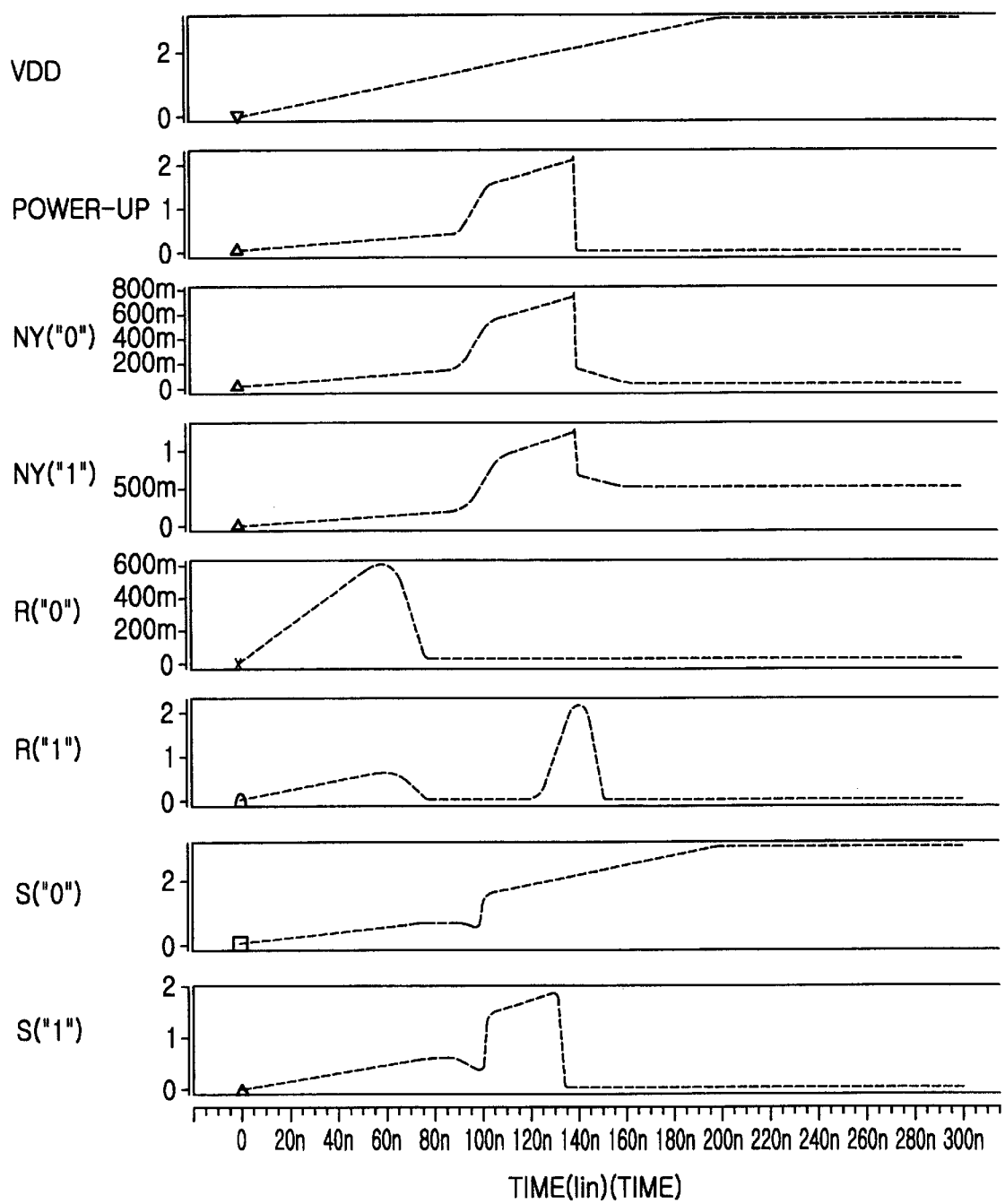
FIG. 10 is a timing chart illustrating simulation result graph at the redundancy address bit programming circuit depicted in FIG. 9.

FIG. 9 is a circuit diagram showing a redundancy address bit programming circuit in accordance with one embodiment of the present invention. FIG. 10 is a timing chart representing the simulated output therefrom.

Referring to FIGS. 9 and 10, the amplification circuit 206 includes: a PMOS transistor P22; an NMOS transistor N22; and an inverter INV22. The drain-source path of the PMOS transistor P22 and the NMOS transistor N22 is connected in serial between a power signal VDD and a ground level VSS. Then a node signal NY is applied to the gate of the NMOS transistor N22, and the gate of the PMOS transistor P22 is coupled to the common drain/source of the PMOS transistor P22 and the NMOS transistor N22. In addition, the common drain/source of the PMOS transistor P22 and the NMOS transistor N22 is coupled to the input of the inverter INV22.

The node signal NY, which varies according to the stored value at the ferroelectric capacitor FC, is first amplified by the common source amplifier composed of the PMOS transistor P22 and the NMOS transistor N22 and then second amplified by the inverter INV22. Herein, a sensor amplifier can be implemented for the inverter INV22. Accordingly, the output R of the amplification circuit 206 can be a "high" level or a "low" level according to the threshold voltage. As can be seen in FIG. 10, when the data "1" is stored in the ferroelectric capacitor FC, the output R of the amplification circuit 206 is to be a "high" level, and when the data "0" is stored in the ferroelectric capacitor FC, the output R of the amplification circuit 206 can be a "low" level.

The latch 208 includes two cross-coupled NOR gates NR22 and NR24. When the power-up input signal is a "high' level, the output of the NOR gate NR24 can be a "low" level, so the NOR gate NR22 reverses the output of the amplification circuit 206 and outputs a reversed output as a selection signal S. Accordingly, when the power-up input signal is a "high" level, the node signal in accordance with the program status of the ferroelectric capacitor FC is amplified through the amplification circuit 206, and is reversed and outputted by the NOR gate NR22 of the latch 208. On the other hand, when the power-up input signal is to be again a "low" level, and since the selection signal S is latched by the NOR gate NR24 and NR22, so the selection signal S is kept as a previous status.

The multiplexer 210 includes two transmission gates T22 and T24 and an inverter INV24. When the selection signal S is a "low" level, the transmission gate T22 can be turn-on, so an address bit signal A is outputted as Q, on the other hand, when the selection signal S is a "high" level, the transmission gate T24 can be turn-on, so a reversed address bit signal /A is outputted. It is easily acknowledged by those skilled in the art that in the embodiment as depicted in FIG. 9, a logic "high" and a logic "low" can be exchanged for another implementation. In the FIG. 10, it is represented that: VDD is a power signal; POWER-UP is power-up input signal; NY ("0") is the node signal NY when the data is "0"; NY ("1") is the node signal NY when the data is "1"; R ("0") is the output of the amplification circuit 206 when the data is "0"; R ("1") is the output of the amplification circuit 206 when the data is "1"; S ("0") is the selection signal S when the data is "0"; S ("1") is the selection signals when the data is "1".

Figure 11:
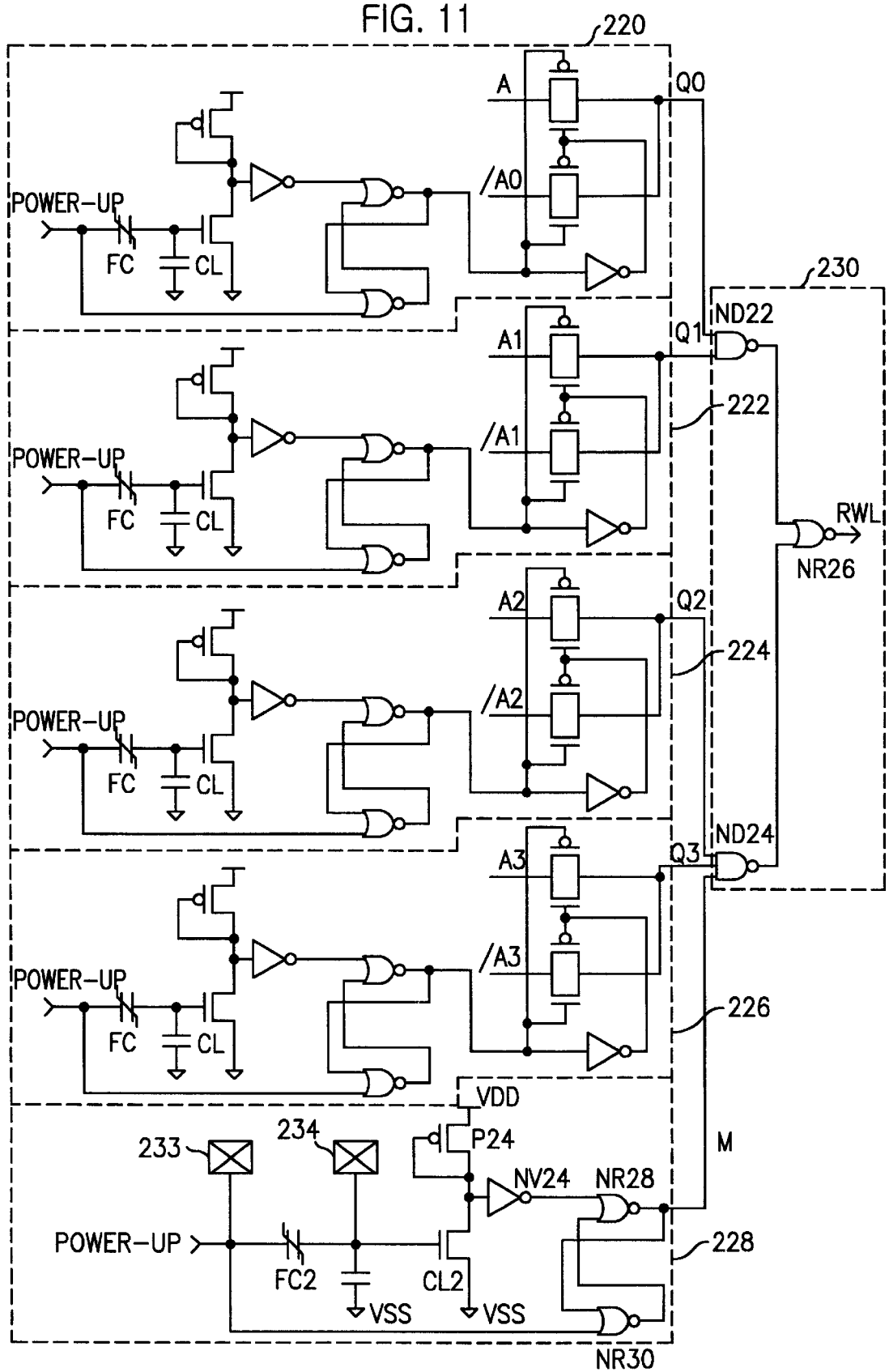
FIG. 11 is a circuit diagram of the redundancy address programming circuit in the case of the 4-bit address in accordance with the present invention.

FIG. 11 represents a redundancy address programming circuit in the case of the 4-bit address in accordance with one of the preferred embodiments of the present invention, which includes: four redundancy address bit programming circuits 220, 222, 224, and 226; a redundancy master programming circuit 228; and a detection circuit 230.

The four redundancy address bit programming circuits 220, 222, 224, and 226 selectively outputs each one of the responding address bit signals A0, A1, A2, and A3, or each of reversed responding address bit signals /A0, /A1, /A2, and /A3 in accordance with the built-in ferroelectric capacitor FC. Herein, the ferroelectric capacitor FC is to be programmed for the defected cell according to the bit value of the address. When inputted address signals A0, A1, A2, and A3 are identical to a defected address signals, all the outputs Q0, Q1, Q2, and Q3 become a "high" level.

The redundancy master programming circuit 228 includes: a ferroelectric capacitor FC2, a load capacitor CL2, an amplifier, a latch, programming pads 232 and 234. Herein, the amplifier is composed of a PMOS transistor P24, an NMOS transistor N24, an inverter INV24, and the latch is composed of two NOR gates NR28 and NR30.

When a corresponding redundancy memory cell is used in replace of a defected memory cell, the data "0" is stored at the ferroelectric capacitor FC2 through the programming pads 232 and 234, otherwise, the data "1" is stored. Since the operation of the master programming circuit 228 is substantially similar to that of the redundancy address bit programming circuit depicted in FIG. 9, when a redundancy cell is used, the output M is a "high" level, otherwise, the output is "low".

When a corresponding redundancy memory cell is used for the detection circuit 230 and a corresponding defected address is inputted, the redundancy word line selection signal RWL, which is a "high" level, is outputted. In detail, the detection circuit 230 includes NAND gates ND22 and ND24 and NOR gate NR26, so the detection circuit 230 detects the case that the outputs Q0, Q1, Q2 and Q3 of the redundancy address bit programming circuits 220, 222, 224 and 226 are a "high" level, and the case that the output M of the master programming circuit 228 is a "high" level.

Figure 12:
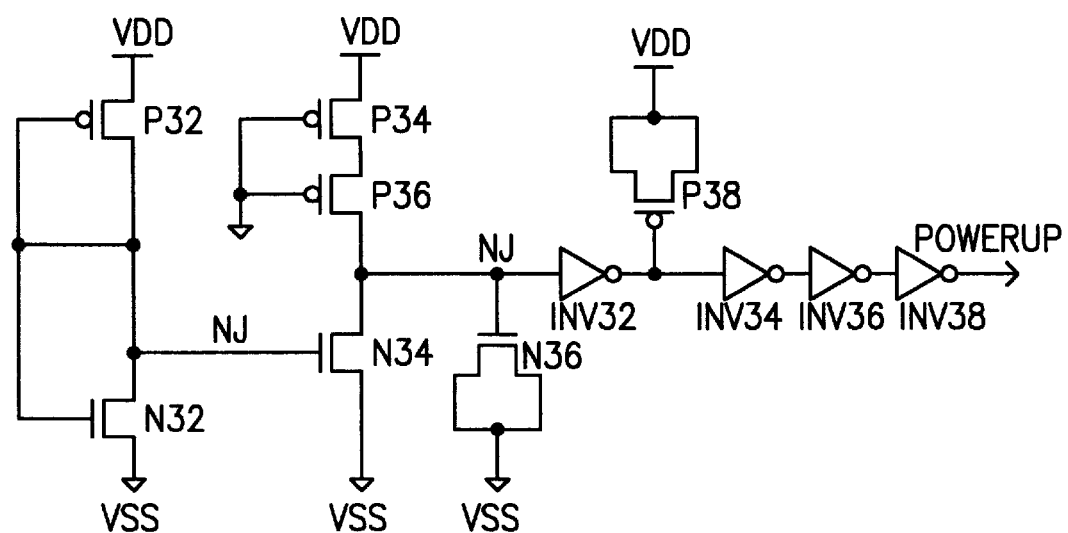
FIG. 12 is a circuit diagram of a circuit for generating the power-up input signal in accordance with the present invention.

FIG. 12 represents a circuit for generating the power-up in accordance with the present invention.

As shown in FIG. 12, since the gates of the PMOS transistor P32 and NMOS transistor N32 are coupled to each nodes NI, the higher the power signal VDD increases, the higher the signal level of the node NI increases. Herein, when the node NI level is higher than the threshold voltage, the NMOS transistor N34 becomes turn-on and the node NJ becomes a "low" level. The node NJ level is buffered through the INV32, INV 34, INV 36 and INV 38, and outputted. Since the PMOS transistor P34 and P36 operates as a load, the node NJ increases at the beginning, as the power signal VDD increases; after the NMOS transistor N34 becomes turn-on, the node NJ becomes a "low" level. Also, the NMOS transistor N32 and the PMOS transistor P38 operates as a capacitor and removes a harmonic distortion.

On the other hand, the power-up generation circuit depicted in FIG. 12 controls the size of the PMOS transistors P32, P34 and P36 and the NMOS transistors N32 and N34 so as to be transformed to the power-up, the power-up/down and the power-down.

Figure 14:
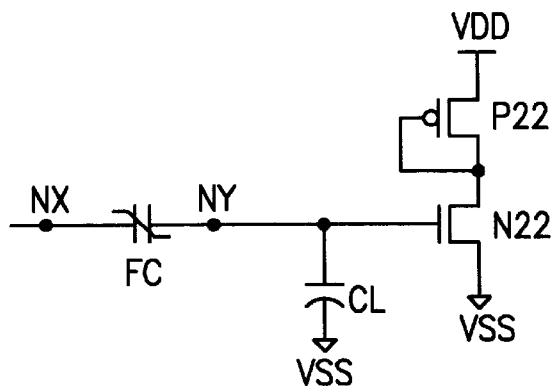
FIGS. 14, 15A and 15B are diagrams explaining re-programming of a ferroelectric capacitor FC at redundancy address bit programming circuits in accordance with another embodiment of the present invention.
Figure 15A:
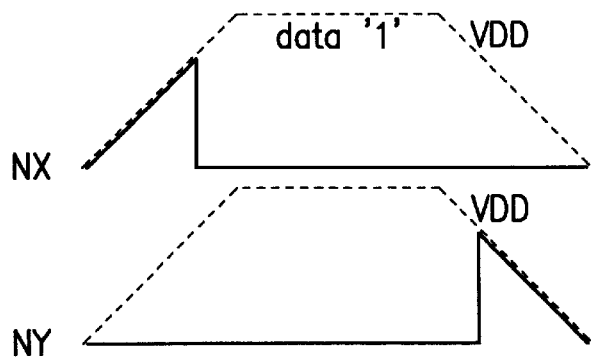
Figure 15B:
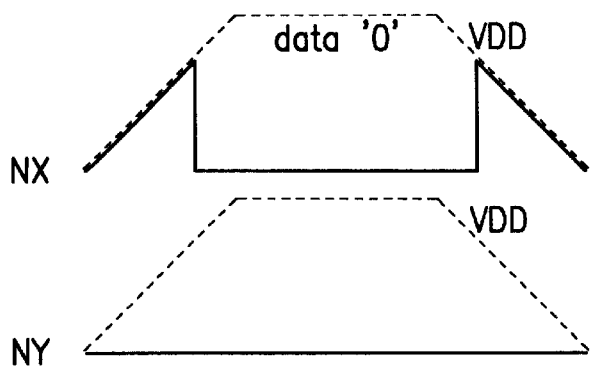

FIG. 14 and FIG. 15A and 15B are exemplary diagrams describing the ferroelectric capacitor FC reprogramming at the redundancy address bit programming circuit in accordance with the present invention.

Figure 16:
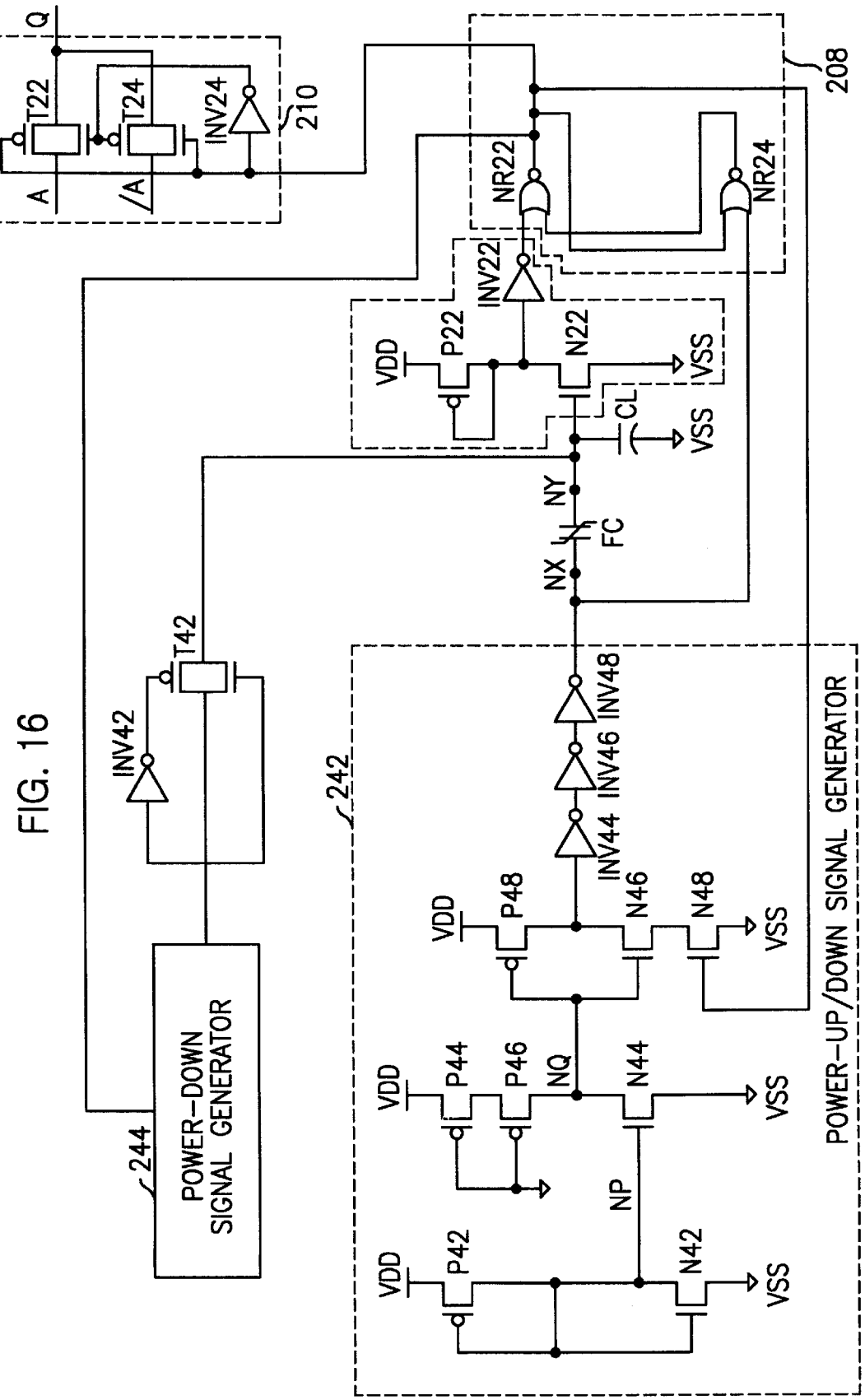
FIG. 16 is a circuit diagram illustrating redundancy address bit programming circuits in accordance with another embodiment of the present invention.

If the data is read at the ferroelectric capacitor, the stored data is destroyed, so re-storing the data is indispensable in order to read the data again. If the data is "1", as can be seen in FIG. 15A, the ground level VSS is applied to the node NX, and the "high" level is applied to the node NY, so the ferroelectric capacitor is to be returned to the "B" status in FIG. 4A. On the other hand, if the data is "0", as can be seen in FIG. 15B, the "high"level is applied to the node NX, and the ground level VSS is applied to the node NY, so the ferroelectric capacitor is to be returned to the "A" status at FIG. 4A. FIG. 16 represents a redundancy address bit programming circuit in accordance with the present invention, which is capable of providing a method for re-inscribing the data stored in the ferroelectric capacitor.

The power-up/down signal generator 242 shown in FIG. 16 can generate the signal applied to the node NX as can be seen in FIGS. 15A and 15B. On the other hand, the power-up/down signal is to follow the level of the power signal level VDD both at the beginning of the power signal VDD supply and at the end of the power signal VDD supply, while, during the stability of the power signal VDD supply, the power-up/down signal is to be the ground level VSS signal. The node level follows the power signal VDD level in a constant ratio by the PMOS transistor P42 and the NMOS transistor N42, and if the node NP is a "high" level, the NMOS transistor N44 becomes turn-on. When the NMOS transistor becomes turn-on, the node NQ represents a ground level, otherwise, the node represents a lower voltage level by the amount of the voltage level caused by the voltage drop PMOS transistor P44 and P46. Accordingly, by setting a lower power level caused by the PMOS transistor, the power signal VDD level is at the end of the power supply. Also, the PMOS transistor P48 and the NMOS transistor N46 operates as the inverters. As a result, the node signal NQ is buffered and outputted by the inverter P48 and N46 and the serially coupled inverters INV44, INV46 and INV48. When the selection signal S is a "high" level, the NMOS transistor N48 becomes turn-on, otherwise, the NMOS transistor N48 becomes turn-off.

Accordingly, when the power begins to start, the power-up/down signal generator 242 outputs the signal following the power signal VDD, and when the power begins to end, the power-up/down signal generator outputs to the node NX the signal following a ground level or the power signal in response to the selection signal S. That is, when the selection signal S is a "low" level, the NX, as can be seen in FIG. 15A, can be outputted, when the selection signal S is a "high" level, the NX shown in FIG. 15B, can be outputted.

Figure 13:
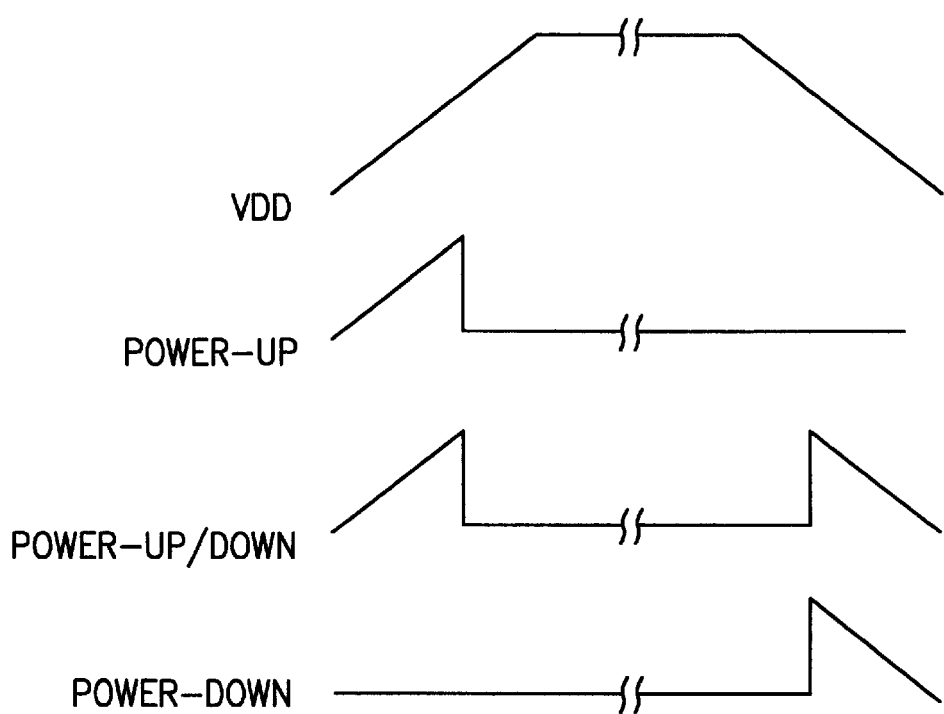
FIG. 13 is a waveform diagram explaining power-up, power-up/down, and power-down input signals.

The power-down generator 244 generates a power-down signal shown in FIG. 13. When the power-down signal generator 244 outputs a "high" level, the transmission gate T42 becomes turn-on and then transfers to the node NY the output of the power-down signal generator 244. Thus, the previously stored data status is inputted again in the ferroelectric capacitor FC.

In the present invention, it is construed that the power-up signal or the power-up/down signal starts to follow from a ground level to 50~80% at the beginning of the power supply and decreases to the ground level; and in addition, at the end of the power supply the power-up signal or the power-up/down signal starts to follow from 50~80% decreasing.

While the principal and the spirit of the present invention has been described entirely in accordance with the preferred embodiment, it is to be noticed that the embodiment is only illustrative and is not restricted to the limit. In addition, those skilled in the art would appreciate that other modification and variations may be made without departing from the spirit and scope of the present invention as set forth in the following claims.

What is claimed is:

1. A redundancy address bit programming circuit including a redundancy memory cell, comprising:

program pads for providing signals to first and second program nodes;

a ferroelectric capacitor programmed according to a bit value corresponding to a defected address, coupled between the first and second nodes;

a load capacitor coupled between the second program node and a ground;

a power-up signal generator means for generating a power-up signal to be coupled to the first program node, wherein the power-up signal follows a level of a power signal at a beginning of a power signal supply, and is maintained as a ground level during a stable level state of the power signal supply;

a latch means for latching the second program node signal at the beginning of the power signal supply and outputting a latched signal during the stable level state of the power signal supply; and a multiplexer for selectively outputting one of an address bit signal and a reversed address bit signal in response to the latched signal.

2. The redundancy address bit programming circuit as recited in claim 1, further comprising an amplification circuit for amplifying a second program node signal.

3. The redundancy address bit programming circuit as recited in claim 2, wherein the amplification circuit comprises:

a PMOS transistor and an NMOS transistor of which the drain-source path is coupled in a serial fashion between the power signal supply and the ground, wherein the gate of the PMOS transistor is connected to the common drain/source of the PMOS transistor and the NMOS transistor and a gate of the NMOS transistor is connected to the program node; and an inverter of which an input is connected to a drain-source path, and an output is coupled to the latch means.

4. The redundancy address bit programming circuit as recited in claim 3, wherein the latch means comprises two NOR gates, and wherein the output of the amplification circuit and a program node signal are coupled to input ports of NOR gates, respectively, and the other input port of each NDR gate is coupled to an output port of each NDR gate.

5. The redundancy address bit programming circuit as recited in claim 4, wherein the multiplexer comprises two transmission gates being alternatively turned-on in response to the latched signal, for outputting the address bit signal and the reversed address bit signal.

6. A redundancy address programming circuit for use in a semiconductor memory device, comprising:

a) a power-up generator means for generating a power-up signal, wherein a level of the power-up signal follows a level of a power signal at a beginning of a power signal supply and becomes a ground level during a stable level state of the power signal supply;

b) a plurality of redundancy address bit programming circuits, each having a first built-in ferroelectric capacitor, wherein the first built-in ferroelectric capacitor is programmed in response to a corresponding defected address bit value, for detecting a coincidence between the corresponding defected address bit value and an input address bit value;

c) a master programming circuit having a second built-in ferroelectric capacitor, wherein the second built-in ferroelectric capacitor is programmed according as whether a defected memory cell is replaced by a corresponding redundancy memory cell; and d) a detection circuit for activating a redundancy word line selection signal by detecting whether a defected address corresponding to that of a redundancy memory cell is inputted on the basis of outputs from the redundancy bit programming circuits and the output of the master programming circuit, wherein each redundancy address bit programming circuit includes:

1) program pads for applying signals to program nodes, wherein the power-up signal is inputted to the program node;

2) a ferroelectric capacitor, which is coupled between the program nodes, and which is programmed in accordance with a corresponding defected address bit value;

3) a load capacitor coupled between the program node and a ground;

4) a latch means, wherein the program node signal is latched at the beginning of the power signal supply, and wherein the latched status is kept and outputted during a stable level state of the power signal supply; and 5) a multiplexer for selectively outputting one of an address bit signal and a reversed address bit signal in accordance with a latched signal.

7. The redundancy address programming circuit as recited in claim 6, wherein the master programming circuit comprises:

a) first and second program pads for providing signals to first and second program nodes, wherein the power-up signal is coupled to the first program pad;

b) a ferroelectric capacitor connected between the first and second program nodes and programmed according to a bit value corresponding to a defected address;

c) a load capacitor coupled between the second program node and a ground;

d) a latch means for latching a second program node signal at the beginning of the power signal supply and outputting the latched signal during the stable level state of the power signal supply.

8. The redundancy address programming circuit as recited in claim 7, wherein said each redundancy programming circuit comprises an amplification circuit for amplifying the second program node signal.

9. A redundancy address bit programming circuit including a redundancy memory cell, comprising:

a) first and second program pads for providing signals to first and second program nodes;

b) a ferroelectric capacitor programmed according to a bit value corresponding to a defected address, coupled between the first and second program nodes;

c) a load capacitor coupled between the second program node and a ground;

d) a latch means for latching a second program node signal at the beginning of a power signal supply and outputting a latched signal during a stable level state of the power signal supply;

e) a power-up/down signal generator means for generating a power-up/down signal to be coupled to the first program node, wherein the power-up signal follows the level of a power signal at a beginning of a power signal supply, and is maintained as a ground level during a stable level state of the power signal supply;

f) a power-down signal generator means for generating a power-down signal in response to the latched signal; and g) a multiplexer for selectively outputting one of a address bit signal and a reversed address bit signal in response to the latched signal.

10. The redundancy address bit programming circuit as recited in claim 9, further comprising an amplification circuit for amplifying a second program node signal.

11. The redundancy address bit programming circuit as recited in claim 10, wherein the amplification circuit comprises:

a) a PMOS transistor and a NMOS transistor of which the drain-source path is coupled in a serial fashion between the power signal supply and the ground, wherein a gate of the PMOS transistor is connected to the common drain/source of the PMOS transistor and the NMOS transistor, and the gate of the NMOS transistor is connected to the program node; and b) an inverter of which an input is connected to the drain-source path and the output is coupled to the latch means.

12. The redundancy address bit programming circuit as recited in claim 11, wherein the latch means comprises first and second NOR gates, and wherein the output of the amplification circuit and a first program node signal are coupled to an input port of the NOR gates, respectively, and the other input port of each NDR gate is coupled to an output port of each NDR gate.

13. The redundancy address bit programming circuit as recited in claim 12, wherein the multiplexer comprises two transmission gates being alternatively turned-on in response to the latched signal, for selectively outputting an address bit signal and an reversed address bit signal.

14. A redundancy address programming circuit for use in a semiconductor memory device, comprising:

a) a power-up generator means for generating a power-up signal, wherein a level of the power-up signal follows a level of a power signal at a beginning of a power signal supply and becomes a ground level during a stable level state of the power signal supply;

b) a plurality of redundancy address bit programming circuits, each having a first built-in ferroelectric capacitor, wherein the first built-in ferroelectric capacitor is programmed in response to a corresponding defected address bit value, for detecting a coincidence between the corresponding defected address bit value and an input address bit value;

c) a master programming circuit having a second built-in ferroelectric capacitor, wherein the second built-in ferroelectric capacitor is programmed according as whether a defected memory cell is replaced by a corresponding redundancy memory cell; and d) a detection circuit for activating a redundancy word line selection signal by detecting whether a defected address corresponding to that of a redundancy memory cell is inputted on the basis of an output from a redundancy bit programming circuit and an output of the master programming circuit;

wherein the redundancy address bit programming circuit including a redundancy memory cell, comprising:

a) first and second program pads for providing signals to first and second program nodes;

b) a ferroelectric capacitor programmed according to a bit value corresponding to the defected address, coupled between the first and second program nodes;

c) a load capacitor coupled between the second program node and a ground;

d) a latch means for latching a second program node signal at the beginning of the power signal supply and outputting a latched signal during a stable level state of the power signal;

e) a power-up/down signal generator means for generating a power-up/down signal to be coupled to the first program node, wherein the power-up signal follows a level of the power signal at the beginning of a power signal supply, and is maintained as a ground level during a stable level state of the power signal supply;

f) a power-down signal generator means for generating the power-down signal in response to a latched signal; and g) a multiplexer for selectively outputting one of an address bit signal and a reversed address bit signal in response to the latched signal.

* * * * *